United States Patent
Goto

(10) Patent No.: US 8,049,181 B2
(45) Date of Patent: *Nov. 1, 2011

(54) METHOD OF SUPPRESSING BEAM POSITION DRIFT, METHOD OF SUPPRESSING BEAM DIMENSION DRIFT, AND CHARGED PARTICLE BEAM LITHOGRAPHY SYSTEM

(75) Inventor: Kazuya Goto, Tokyo (JP)

(73) Assignee: JEOL Ltd., Tokyo (JP)

( * ) Notice: Subject to any disclaimer, the term of this patent is extended or adjusted under 35 U.S.C. 154(b) by 298 days.

This patent is subject to a terminal disclaimer.

(21) Appl. No.: 12/369,306

(22) Filed: Feb. 11, 2009

(65) Prior Publication Data

US 2009/0230316 A1    Sep. 17, 2009

(30) Foreign Application Priority Data

Mar. 12, 2008    (JP) .................... 2008-62394

(51) Int. Cl.
*G21K 1/08* (2006.01)
*H01J 3/14* (2006.01)

(52) U.S. Cl. ................. 250/396 R; 250/397; 250/492.3; 250/492.2; 250/491.1; 250/307; 250/308; 250/309; 250/311; 250/396 ML

(58) Field of Classification Search .............. 250/396 R, 250/397, 492.3, 310, 492.2, 491.1, 492.22, 250/311, 307–309, 396 ML See application file for complete search history.

(56) References Cited

U.S. PATENT DOCUMENTS

| | | | |
|---|---|---|---|
| 5,130,550 A | | 7/1992 | Nakamura et al. |
| 5,315,123 A | * | 5/1994 | Itoh et al. .................. 250/492.2 |
| 5,892,237 A | * | 4/1999 | Kawakami et al. ...... 250/492.22 |
| 6,436,594 B2 | | 8/2002 | Tokunaga |
| 6,437,347 B1 | | 8/2002 | Hartley et al. |
| 6,573,516 B2 | | 6/2003 | Kawakami |

* cited by examiner

*Primary Examiner* — Robert Kim
*Assistant Examiner* — Meenakshi Sahu
(74) *Attorney, Agent, or Firm* — The Webb Law Firm

(57) ABSTRACT

A lithography method and system have means for determining a convergence value $d_c$ from a relation of beam current to beam position drift (or beam dimension drift) produced in the past; means for finding a beam current i(t) as a function of the convergence value $d_c$ of beam position drift (or beam dimension drift), a measured value $d_m$ of beam position drift (or beam dimension drift), a gain constant g, and a convergence value c of beam position drift (or beam dimension drift) per unit beam current and using an equation given by $i(t)=\{(1+g) \cdot d_c - g \cdot d_m(t)\}/c$; means for making a check regarding $d_m$ and $d_c$ as to whether $d_m$ approaches $d_c$ and, thus, a relationship given by $|d_m - d_c| < \epsilon$ holds, where $\epsilon$ is a positive number providing a decision criterion under the condition where the gain constant g of the beam current i(t) satisfies a relationship given by g>0.

6 Claims, 2 Drawing Sheets

METHOD OF SUPPRESSING BEAM POSITION DRIFT, METHOD OF SUPPRESSING BEAM DIMENSION DRIFT, AND CHARGED PARTICLE BEAM LITHOGRAPHY SYSTEM

BACKGROUND OF THE INVENTION

1. Field of the Invention

The present invention relates to a method of suppressing beam position drift. The present invention also relates to a method of suppressing beam dimension drift. Furthermore, the present invention relates to a charged-particle beam lithography system. More particularly, the present invention relates to a method of suppressing beam position drift in such a way that the drift converges rapidly. In addition, the present invention relates to a method of suppressing beam dimension drift in such a way that the drift converges rapidly. Further, the present invention relates to a charged-particle beam lithography system in which such methods can be implemented.

2. Description of Related Art

An example of a variable-shaped electron beam lithography system generally used today is shown in FIG. 1. As shown in the figure, an electron beam 1 is made to hit a shaping apertured plate 3 via an illumination lens 2. An image 5 of a light source 4 is formed under the apertured plate 3. Then, an image of the apertured plate 3 is projected onto a second shaping apertured plate 7 via a shaping lens 6. A geometrical figure determined by overlap between the image of the shaping apertured plate 3 and the shaping apertured plate 7 is projected onto a material 10 via a demagnification lens 8 and an objective lens 9. A resist (photosensitive material) is applied on the material 10.

In this way, the resist is exposed. The shape and size of the projected figure can be varied by moving the image of the shaping apertured plate 3 relative to the shaping apertured plate 7 by a deflector 11. The position of the projected figure can be varied by another deflector 12. A pattern can be written on the material 10 by moving the projected figure into a desired position within the plane of the material 10 by the deflector 12.

A pattern can be written beyond a deflection field defined by the deflector 12 by driving the material stage to move the material surface. Electrostatic deflectors are used as the deflectors 11 and 12 to provide high deflection speeds.

As semiconductor devices have been fabricated to achieve ever larger scales of integration, i.e., finer patterns have been written, the required lithographic accuracies, including lithographic dimensional accuracy, and lithographic positional accuracy, have been made more stringent year by year. Recently, lithographic accuracy on the nanometer order has been required.

To improve the lithographic accuracy, it is important to stabilize the path of the electron beam 1. Variations in the path of the beam 1 cause drift in beam dimensions (i.e., cross-sectional dimensions of the beam on the material 10) and in beam position (i.e., the position at which the beam impinges on the material 10). Variations in the beam path are caused for the following reasons.

First, scattering electrons arising from the electron beam 1 and secondary electrons produce electrical charging in the electron optical column, giving rise to an electric field. This, in turn, deflects the beam 1. Because the amount of electric charge varies with time, the amount of deflection also varies with time. Alternatively, the electron beam 1 impinges on the shaping apertured plates 3 and 7, producing heat. This deforms the plates 3 and 7, shifting the positions of the apertures.

The amount of drift in beam dimensions is reduced as the beam dimensions are reduced, for example, by a factor of 10 by the demagnification lens 8. Variations in the beam path produced downstream of the demagnification lens 8 appear as beam position drift rather than as beam dimension drift.

For these reasons, in electron beam lithography systems typified by the optical system of FIG. 1, the amount of beam position drift tends to be greater than the amount of beam dimension drift in theory.

Drifts in beam dimensions and beam position due to variations in the beam path are compensated for by calibrating the system before or during a lithographic operation. The calibration is achieved by measuring and correcting the beam dimensions and position.

The amounts of drifts in beam dimensions and position are measured by detecting a backscattered electron signal and a transmission electron signal which are obtained when marks formed on the material 10 or on the material-moving stage on which the material is placed are scanned with a beam. The marks are used to measure the beam dimensions and position. The beam dimensions and position are corrected by operating the deflectors 11 and 12 by amounts corresponding to the measured dimensional deviations and positional deviation or by shifting the position of the material 10 by means of the material-moving stage.

It is known that drift in beam position increases immediately after the start of a lithographic operation. Even where the system is calibrated periodically during the lithographic operation, if the drift increases, the lithographic accuracy deteriorates.

In an attempt to solve this problem, it is customary to set a wait time prior to a lithographic operation to permit drift in beam position to converge to some extent. During the wait time, the beam current is made closer to the beam current used during the lithography. Writing is done on a region located outside the material 10. In this way, the beam position drift is made to converge.

It is considered that convergence of beam position drift depends on the balance between electrical charging and discharging or between generation and dissipation of heat. However, the time taken for the beam position drift to converge is as long as tens of minutes to several hours. Increasing the wait time is undesirable from the viewpoint of lithography throughput.

Beam position drift is also problematic during calibration of the system. Especially, when deflection field distortion is measured, it takes a long time to measure the beam position. That is, the beam is deflected across a number of points within the deflection field (e.g., 10×10=points). Therefore, beam position drift is increased accordingly during the measurement.

If beam position drift occurs, the drift will settle down after repetitive measurements. Consequently, it is not always necessary to set a wait time in advance when the system is calibrated. However, if the measurement of deflection field distortion is repeated until the beam position drift converges, the measurement time is eventually prolonged greatly.

SUMMARY OF THE INVENTION

It is an object of the present invention to provide a beam position drift-suppressing method of shortening the time taken for beam position drift to converge, a beam dimension drift-suppressing method of shortening the time taken for beam dimension drift to converge, and a charged-particle beam lithography system.

A first embodiment of the present invention provides a method of suppressing positional drift of a beam used in a charged-particle beam system. Let $d_c$ be a value (herein referred to as the convergence value) to which the amount of beam position drift is made to converge, the drift being produced during lithography or calibration of the system. The convergence value $d_c$ is determined from a relation of beam current to the amounts of beam position drift produced in the past. The beam current i(t) is found as a function of the convergence value $d_c$ of the amount of beam position drift, a measured value $d_m$ of the amount of beam position drift, a gain constant g, and a convergence value c of the amount of beam position drift per unit beam current. The beam current i(t) is given by $$i(t)=\{(1+g) \cdot d_c - g \cdot d_m(t)\}/c$$

The gain constant g of the beam current i(t) satisfies the relationship g>0. Let $\epsilon$ be a positive number providing a decision criterion. A check is made regarding $d_m$ and $d_c$ as to whether $d_m$ approaches $d_c$ to thereby satisfy the relationship $|d_m - d_c| < \epsilon$. After the relationship $|d_m - d_c| < \epsilon$ has been achieved, the control of the beam position drift is stopped. Calibration or lithography is performed.

In a second embodiment of the present invention, when a variation in the convergence value $d_c$ is observed, the convergence value $d_c$ is varied by a corresponding amount. This is reflected in the relation of the beam current to the amount of beam position drift.

A third embodiment of the present invention provides a charged-particle beam lithography system having a function of suppressing beam position drift in the charged-particle beam lithography system. Let $d_c$ be a convergence value to which the amount of beam position drift is made to converge, the drift being produced during lithography or calibration of the system. The system has means for determining the convergence value $d_c$ of the amount of beam position drift from a relation of beam current to the amounts of position drift produced in the past. Furthermore, the system has means for finding the beam current i(t) as a function of the convergence value $d_c$ of the amount of beam position drift, a measured value $d_m$ of the amount of beam position drift, a gain constant g, and a convergence value c of the amount of beam position drift per unit beam current. The beam current i(t) is given by $$i(t)=\{(1+g) \cdot d_c - g \cdot d_m(t)\}/c$$

In addition, the system has means for making a check regarding $d_m$ and $d_c$ as to whether $d_m$ approaches $d_c$ to thereby satisfy the relationship $|d_m - d_c| < \epsilon$, where $\epsilon$ is a positive number providing a decision criterion under the condition where the gain constant g of the beam current i(t) satisfies a relationship given by g>0. When the relationship $|d_m - d_c| < \epsilon$ is achieved, the control of the beam position drift is stopped. Calibration or lithography is performed.

A fourth embodiment of the present invention provides a method of suppressing dimensional drift of a beam used in a charged-particle beam system. Let $d_c$ be a value (herein referred to as the convergence value) to which the amount of beam dimension drift is made to converge, the drift being produced during lithography or calibration of the system. The convergence value $d_c$ is determined from a relation of beam current to the amounts of beam dimension drift produced in the past. The beam current i(t) is found as a function of the convergence value $d_c$ of the amount of beam dimension drift, a measured value $d_m$ of the amount of beam dimension drift, a gain constant g, and a convergence value c of the amount of beam dimension drift per unit beam current. The beam current i(t) is given by $$i(t)=\{(1+g) \cdot d_c - g \cdot d_m(t)\}/c$$

The gain constant g of the beam current i(t) satisfies the relationship g>0. Let $\epsilon$ be a positive number providing a decision criterion. A check is made regarding $d_m$ and $d_c$ as to whether $d_m$ approaches $d_c$ to thereby satisfy the relationship $|d_m - d_c| < \epsilon$. After the relationship $|d_m - d_c| < \epsilon$ has been achieved, the control of the beam dimension drift is stopped. Calibration or lithography is performed.

In a fifth embodiment of the present invention, when a variation in the convergence value $d_c$ is observed, the convergence value $d_c$ is varied by a corresponding amount. This is reflected in the relation of the beam current to the amount of beam dimension drift.

A sixth embodiment of the present invention provides a charged-particle beam lithography system having a function of suppressing beam dimension drift in the charged-particle beam lithography system. Let $d_c$ be a convergence value to which the amount of beam dimension drift is made to converge, the drift being produced during lithography or calibration of the system. The system has means for determining the convergence value $d_c$ of the amount of beam dimension drift from a relation of beam current to the amounts of dimension drift produced in the past. Furthermore, the system has means for finding the beam current i(t) as a function of the convergence value $d_c$ of the amount of beam dimension drift, a measured value $d_m$ of the amount of beam dimension drift, a gain constant g, and a convergence value c of the amount of beam dimension drift per unit beam current. The beam current i(t) is given by $$i(t)=\{(1+g) \cdot d_c - g \cdot d_m(t)\}/c$$

In addition, the system has means for making a check regarding $d_m$ and $d_c$ as to whether $d_m$ approaches $d_c$ to thereby satisfy the relationship $|d_m - d_c| < \epsilon$, where $\epsilon$ is a positive number providing a decision criterion under the condition where the gain constant g of the beam current i(t) satisfies a relationship given by g>0. When the relationship $|d_m - d_c| < \epsilon$ is achieved, the control of the beam dimension drift is stopped. Calibration or lithography is performed.

According to the first embodiment of the present invention, the time taken to allow beam position drift to converge can be shortened by intentionally increasing the beam current.

According to the second embodiment of the present invention, when a variation in the convergence value $d_c$ is observed, the convergence value $d_c$ is modified by a corresponding amount and reflected in the relation of beam current to the amount of beam position drift. Consequently, the beam position drift can be controlled more precisely.

According to the third embodiment of the present invention, the time taken to allow beam position drift to converge can be shortened by intentionally increasing the beam current.

According to the fourth embodiment of the present invention, the time taken to allow beam dimension drift to converge can be shortened by intentionally increasing the beam current.

According to the fifth embodiment of the present invention, when a variation in the convergence value $d_c$ is observed, the convergence value $d_c$ is modified by a corresponding amount and reflected in the relation of beam current to the amount of beam dimension drift. Consequently, the beam dimension drift can be controlled more precisely.

According to the sixth embodiment of the present invention, the time taken to allow beam dimension drift to converge can be shortened by intentionally increasing the beam current.

Other objects and features of the invention will appear in the course of the description thereof, which follows.

DESCRIPTION OF THE PREFERRED EMBODIMENTS

Embodiments of the present invention are hereinafter described in detail with reference to the drawings.

First Embodiment

Figure 1:
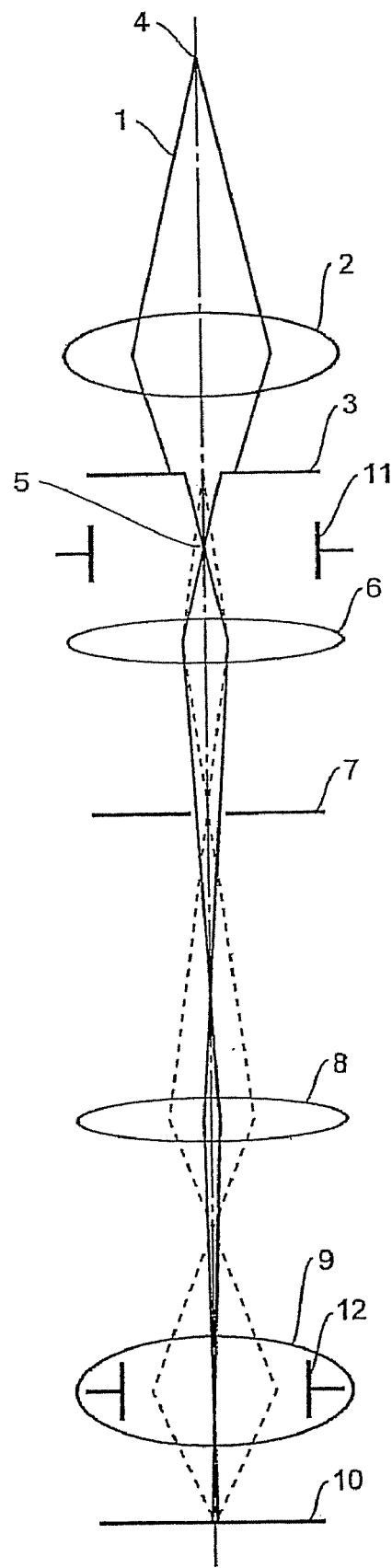
FIG. 1 is a ray diagram of a charged-particle beam system, conceptually illustrating the configuration of the system.

The present invention is applied to a charged-particle beam system shown in FIG. 1. Calculations, operations, and control associated with the present invention are performed by a controller (not shown) that controls the whole operation of the system shown in FIG. 1. For example, a computer is used as the controller.

It is now considered that beam position drift is made to converge quickly and that the wait time required prior to lithography or calibration of the system is shortened. For this purpose, the beam current is intentionally increased compared with the beam current used during lithography or calibration of the system to accelerate convergence of the drift.

In the variable-shaped electron beam lithography system shown in FIG. 1, the deflector 11 is operated to vary the beam dimensions in order to increase the beam current.

Usually, limitations are imposed on the beam dimensions to suppress defocusing due to the Coulomb effect (i.e., electrical charges of identical polarity repel each other and cannot be easily converged) and variations in the resist sensitivity due to resist heating effect. If necessary, the limitations may be temporarily removed. However, the beam current i(t) is not kept constant but determined based on $$i(t) = \{(1+g) \cdot d_c - g \cdot d_m(t)\}/c \quad (1)$$

where $d_c$ is a convergence value of the amount of beam position drift during lithography or calibration of the system and is a function of an average beam current during lithography or calibration of the system. The average beam current is a beam current averaged over a certain period of time. The convergence value $d_c$ is found by interpolation or extrapolation of the relation of the beam current to the amounts of beam position drift produced in the past. $d_m$ is a measured value of the amount of beam position drift and is a function of time t. Before the start of control of beam position drift, it is assumed that i=0 and $d_m$=0. When control of beam position drift is started (t=0), Eq. (1) leads to $$i(0) = (1+g) \cdot d_c/c$$

g is a gain constant. Convergence of beam position drift can be accelerated by increasing the gain constant g (g>0). c is a convergence value of the amount of beam position drift per unit beam current and is constant regardless of the beam current. Let $i_c$ be the average beam current during lithography or calibration of the system. The relationship $d_c = c \cdot i_c$ holds.

The value of the amount of beam position drift $d_m$ is measured periodically but not always at regular intervals. The value $d_m$ does not vary between any two adjacent drift measuring points and is given by a staircase function of time t. Accordingly, the value of beam current i does not vary between any two adjacent drift measuring points. Setting the gain constant g to zero (g=0) is equivalent to not accelerating convergence of beam position drift. When g=0, the beam current is equal to the beam current $i_c = d_c/c$ averaged over a lithography operation or an operation for calibrating the system.

Because of the control provided as described so far, after the beam position drift has converged, i.e., the relationship $|d_m - d_c| < \epsilon$ is maintained over a constant period, the beam current i is equal to the beam current $i_c = d_c/c$ obtained during lithography or calibration of the system. Then, the control over beam position drift is stopped. Lithography or calibration of the system is started. $\epsilon$ is a positive number providing a decision criterion for convergence.

In many cases, in Eq. (1), the relationship $|d_m| < |(1+g) \cdot d_c/g|$ holds. If $|d_m| > |(1+g) \cdot d_c/g|$, then the sign of the beam current i changes. If the gain constant g is increased and the measurement interval is increased, the amount of beam position drift increases between any two adjacent measurement points. Consequently, the aforementioned relationship $|d_m| > |(1+g) \cdot d_c/g|$ may hold. However, if the sign of the beam current i can be varied, beam position drift can be accelerated even in a decreasing direction.

In practice, however, it is impossible to reverse the sign of the beam current i. That is, the sign of the beam cross section cannot be reversed. Therefore, in this case, the beam current is set to 0 (i=0). Under the condition where i=0, beam position drift cannot be accelerated in a decreasing direction. Therefore, the beam position drift converges at low speed. Accordingly, when the value of the gain constant g is increased, it is better to reduce the measurement interval. Alternatively, the gain constant g is set to a large value at the beginning. When the amount of beam position drift $d_m$ has approached the convergence value $d_c$ to some extent, the gain constant g is reduced to prevent the relationship given by $|d_m| > |(1+g) \cdot d_c/g|$ from holding.

It can be considered that the convergence value $d_c$ of the amount of beam position drift produced during lithography or calibration of the system varies with use of the system, i.e., ages on a long term basis. This is caused, for example, by increase in contamination of the inside of the electron optical column. Accordingly, beam position drift occurring during lithography or system calibration carried out after the control of the beam position drift described so far is measured. The beam position drift should not be observed unless the value of the convergence value $d_c$ varies with the lapse of time. If the drift is observed, the convergence value $d_c$ is modified by a corresponding amount and reflected in the relation of the beam current to beam position drift. When the next lithography or system calibration is performed, the convergence value $d_c$ is determined from the updated relation of beam current to beam position drift. As a result, if the convergence value $d_c$ varies, beam position drift can be controlled more precisely.

Figure 2:
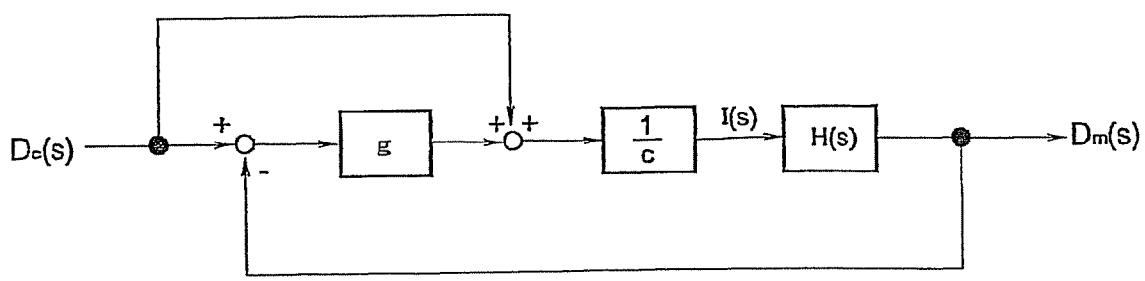
FIG. 2 is a block diagram of a control system for controlling beam position drift.

FIG. 2 is a block diagram of a control system for controlling beam position drift. In the control system of FIG. 2, the following relationships hold:

$$D_m(s) = (1+g) \cdot H(s) \cdot D_c(s)/(c + g \cdot H(s))$$

$$I(s) = \{(1+g) \cdot D_c(s) - g \cdot D_m(s)\}/c$$

where $D_c(s)$, $D_m(s)$, and $I(s)$ are Laplace transforms of $d_c$, $d_m(t)$, and $i(t)$, respectively. Where $t<0$, the convergence value $d_c$ assumes a value of 0. Where $t \geqq 0$, the convergence value $d_c$ assumes a value of 1. That is, the convergence value $d_c$ can be treated as a step function. Thus, we have $D_c(s)=d_c/s$. $H(s)$ is a transfer function indicating the relation of beam current to beam position drift. If $H(s)$ is taken as a first-order lag element, $H(s)$ can be represented in the form:

$$H(s)=c/(1+s\cdot T)$$

where T is a time constant regarding beam position drift. From the final-value theorem, we have $$\lim_{t\to\infty} d_m(t) = \lim_{s\to 0} sD_m(s) = d_c \quad (2)$$

Therefore, it can be seen that the measured value $d_m$ converges to the convergence value $d_c$ with the lapse of time.

To confirm the effectiveness of the method of controlling beam position drift as described so far, we made simulations. The amount of beam position drift $d_m$ measured at some instant of time was substituted into Eq. (1) and the beam current i was determined in accordance with the block diagram of FIG. 2. The amount of beam position drift $d_m$ produced at the next instant of time was found from the beam current i. This series of mathematical operations was repeated. The amount of beam position drift $d_m$ was found by superimposing an output obtained when a rectangular pulsed signal having a magnitude of i was entered into the first-order lag element $H(s)=c/(1+s\cdot T)$.

The time taken to measure the amount of beam position drift was neglected and thus set to 0. The time constant T of the first-order lag element was set to 60 minutes. $d_m$ was measured at intervals of 1 minute. The convergence value $d_c$ was set to 100 nm. The gain constant g was set to 0, 1, 2, 5, 10, and 20, in turn. The results of the simulations are shown in the graph of FIG. 3, where the amount of beam position drift $d_m$ is plotted against time.

These numerical values were so selected that the relationship $|d_m|>|d_c|$ does not hold throughout the period beginning with control of beam position drift and ending with convergence of the measured value of the amount of beam position drift $d_m$. If $|d_m|\leqq|d_c|$, the relationship $|d_m|>|(1+g)\cdot d_c/g|$ does not hold.

Figure 3:
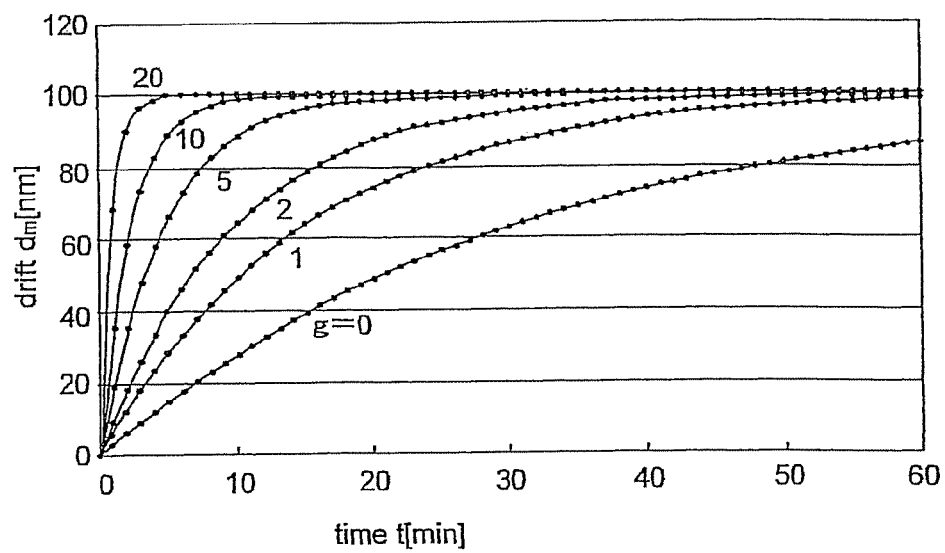
FIG. 3 is a graph showing the results of simulations of the relation of measured value $d_m$ of amount of beam position drift to time.

It can be seen from the graph of FIG. 3 that as the gain constant g is increased, beam position drift converges more quickly. In the graph of FIG. 3, $d_m$ [nm] is plotted on the vertical axis, while time t [min] is plotted on the horizontal axis.

As described in detail so far, according to the present invention, the time taken to permit beam position drift to converge can be shortened by intentionally increasing the beam current.

Embodiment 2

A beam lithography system whose configuration is as shown in FIG. 1 is used. If the average beam current varies during lithography or system calibration, the convergence value $d_c$ also varies. Therefore, new beam position drift occurs.

In embodiment 2, the beam position drift is made to converge quickly. In particular, in embodiment 1, the beam current produced before control of beam position drift is considered to be zero based on Eq. (1). In embodiment 2, cases where the beam current is not zero are treated.

Where the average beam current produced prior to control of beam position drift is nonzero, the difference $i_c$ in average beam current between when the control is not yet provided and when the control is provided (i.e., after beam position drift has converged) is considered to be equal to $d_c/c$ ($i_c=d_c/c$). From this, the equation $d_c=c\cdot i_c$ is determined. In Eq. (1), the beam current i is treated as the amount of variation of the average beam current. The convergence value dc is substituted into Eq. (1), and the beam current i is determined.

Note that the sign of the beam current cannot be varied. Consequently, when the beam current is switched from a large value to a small value, limitations are imposed on acceleration of convergence of beam position drift.

Beam position drift does not occur unless the average beam current varies. Therefore, it is better to make the average beam currents produced during lithography and during system calibration, respectively, close to each other as much as possible.

In the above embodiments, a technique for causing beam position drift to converge has been described. However, the present invention is not limited to this. The same concept can be applied to the case where beam dimension drift is made to converge quickly. That is, where beam dimension drift occurs, the present invention can be applied to the case where variations in the beam path between the shaping apertured plates 3 and 7 are made to converge quickly.

Furthermore, in the above embodiments, an electron beam lithography system is taken as an example of a charged-particle beam lithography system. The present invention is not limited to this. The present invention can also be applied to the case where an ion beam is used as a charged-particle beam.

Additionally, in the above embodiments, a variable shaped charged-particle beam lithography system is taken as an example of a charged-particle beam lithography system. The present invention is not limited to this. The present invention can similarly be applied to a spot-beam charged-particle beam lithography system.

As described in detail thus far, according to the present invention, beam position drift (or beam dimension drift) that presents problems during lithography or calibration of a charged-particle beam lithography system is made to converge in order to improve the lithographic accuracy and system calibration accuracy. This method has the following features.

1) The beam current is increased intentionally as compared with the beam current used during lithography or system calibration until beam position drift (or beam dimension drift) converges. Consequently, convergence of the beam position drift drift (or beam dimension drift) is accelerated.

2) Especially, the beam current is determined from Eq. (1), i.e., from the relationship $$i(t)=\{(1+g)\cdot d_c-g\cdot d_m(t)\}/c$$

Furthermore, the gain constant g (g>0) is increased. In this way, beam position drift (or beam dimension drift) is controlled. As a result, 3) beam position drift (or beam dimension drift) is made to converge quickly. That is, the wait time can be shortened.

Having thus described my invention with the detail and particularity required by the Patent Laws, what is desired protected by Letters Patent is set forth in the following claims.

The invention claimed is:

1. A method of suppressing positional drift of a beam used in a charged-particle beam lithography system, wherein a wait time for convergence of the drift of the beam prior to lithographic operation or calibration of the system is reduced, said method comprising the steps of:
- setting the beam current to a higher value than the current used during lithographic operation or calibration of the system;
- repeatedly measuring the beam drift $d_m$, and
- gradually reducing the beam current according to the following steps:
  - determining a convergence value $d_c$ to which the amount of beam position drift produced during lithography or system calibration converges from a relation of beam current to amounts of beam position drift occurred in the past;
  - finding a beam current i(t) as a function of the convergence value $d_c$ of the amount of beam position drift, a measured value $d_m$ of the amount of beam position drift, a gain constant g, and a convergence value c of the amount of beam position drift per unit beam current and using an equation given by $i(t)=\{(1+g)\cdot d_c-g\cdot d_m(t)\}/c$;
  - making a check regarding $d_m$ and $d_c$ as to whether a relationship given by $|d_m-d_c|<\epsilon$ holds, where $\epsilon$ is a positive number providing a decision criterion under the condition where the gain constant g of the beam current i(t) satisfies a relationship given by g>0; and
  - stopping control of the beam position drift after the relationship $|d_m-d_c|<\epsilon$ has been achieved and performing lithography or calibration.

2. A method of suppressing positional drift of a beam as set forth in claim 1, wherein when a variation in the convergence value $d_c$ is observed, the convergence value $d_c$ is modified by a corresponding amount and reflected in the relation of beam current to the amount of beam position drift.

3. A charged-particle beam lithography system having a function of suppressing positional drift of a beam used in the system, wherein a wait time for convergence of the drift of the beam prior to lithographic operation or calibration of the system is reduced, said charged-particle beam lithography system comprising:
- means for setting the beam current to a higher value than the current used during lithographic operation or calibration of the system;
- means for repeatedly measuring the beam drift $d_m$; and
- means for gradually reducing the beam current with the following means:
  - means for determining a convergence value $d_c$ to which the amount of beam position drift produced during lithography or system calibration converges from a relation of beam current to amounts of beam position drift produced in the past;
  - means for finding a beam current i(t) as a function of the convergence value $d_c$ of the amount of beam position drift, a measured value $d_m$ of the amount of beam position drift, a gain constant g, and a convergence value c of the amount of beam position drift per unit beam current and using an equation given by $i(t)=\{(1+g)\cdot d_c-g\cdot d_m(t)\}/c$;
  - means for making a check regarding $d_m$ and $d_c$ as to whether a relationship given by $|d_m-d_c|<\epsilon$ holds, where $\epsilon$ is a positive number providing a decision criterion under the condition where the gain constant g of the beam current i(t) satisfies a relationship given by g>0; and
  - means for stopping the control of the beam position drift after the relationship $|d_m-d_c|<\epsilon$ has been achieved and performing calibration or lithography.

4. A method of suppressing dimensional drift of a beam used in a charged-particle beam lithography system, wherein a wait time for convergence of the drift of the beam prior to lithographic operation or calibration of the system is reduced, said method comprising the steps of:
- setting the beam current to a higher value than the current used during lithographic operation or calibration of the system;
- repeatedly measuring the beam drift $d_m$; and
- gradually reducing the beam current according to the following steps:
  - determining a convergence value $d_c$ to which the amount of beam dimension drift produced during lithography or system calibration converges from a relation of beam current to amounts of beam dimension drift occurred in the past;
  - finding a beam current i(t) as a function of the convergence value $d_c$ of the amount of beam dimension drift, a measured value $d_m$ of the amount of beam dimension drift, a galls constant g, and a convergence value c of the amount of beam dimension drift per unit beam current and using an equation given by $i(t)=\{(1+g)\cdot d_c-g\cdot d_m(t)\}/c$;
  - making a check regarding $d_m$ and $d_c$ as to whether a relationship given by $|d_m-d_c|<\epsilon$ holds, where $\epsilon$ is a positive number providing a decision criterion under the condition where the gain constant g of the beam current i(t) satisfies a relationship given by g>0; and
  - stopping control of the beam dimension drift after the relationship $|d_m-d_c|<\epsilon$ has been achieved and performing lithography or calibration.

5. A method of suppressing dimensional drift of a beam as set forth in claim 4, wherein when a variation in the convergence value $d_c$ is observed, the convergence value $d_c$ is modified by a corresponding amount and reflected in the relation of beam current to the amount of beam dimension drift.

6. A charged-particle beam lithography system having a function of suppressing dimensional drift of a beam used in the system, wherein a wait time for convergence of the drift of the beam prior to lithographic operation or calibration of the system is reduced, said charged-particle beam lithography system comprising:
- means for setting the beam current to a higher value than the current used during lithographic operation or calibration of the system;
- means for repeatedly measuring the beam drift $d_m$; and
- means for gradually reducing the beam current with the following means:
  - means for determining a convergence value $d_c$ to which the amount of beam dimension drift produced during lithography or system calibration converges from a relation of beam current to amounts of beam dimension drift produced in the past;
  - means for finding a beam current i(t) as a function of the convergence value $d_c$ of the amount of beam dimension drift, a measured value $d_m$ of the amount of beam dimension drift, a gain constant g, and a convergence value c of the amount of beam dimension drift per unit beam current and using an equation given by $i(t)=\{(1+g)\cdot d_c-g\cdot d_m(t)\}/c$;
  - means for making a check regarding $d_m$ and $d_c$ as to whether a relationship given by $|d_m-d_c|<\epsilon$ holds, where $\epsilon$ is a positive number providing a decision criterion under the condition where the gain constant g of the beam current i(t) satisfies a relationship given by g>0; and
  - stopping the control of the beam dimension drift after the relationship $|d_m-d_c|<\epsilon$ has been achieved and performing calibration or lithography.

* * * * *

UNITED STATES PATENT AND TRADEMARK OFFICE
CERTIFICATE OF CORRECTION

| | | |
|---|---|---|
| PATENT NO. | : 8,049,181 B2 | Page 1 of 1 |
| APPLICATION NO. | : 12/369306 | |
| DATED | : November 1, 2011 | |
| INVENTOR(S) | : Kazuya Goto | |

It is certified that error appears in the above-identified patent and that said Letters Patent is hereby corrected as shown below:

On the title page, item (54), Line 4, delete "CHARGED PARTICLE" and insert
-- CHARGE-PARTICLE --

Face of Patent, Column 1, Item (*) Notice, delete "This patent is subject to a terminal disclaimer."

Column 1, Line 4, delete "CHARGED PARTICLE" and insert -- CHARGE-PARTICLE --

Column 9, Line 6, Claim 1, delete "dm, and" and insert -- dm; and --

Column 9, Line 20, Claim 1, delete "dm," and insert -- dm --

Column 10, Line 17, Claim 6, delete "galls" and insert -- gain --

Signed and Sealed this
Twenty-eighth Day of February, 2012

David J. Kappos
*Director of the United States Patent and Trademark Office*